United States Patent
Venugopalan

(10) Patent No.: US 7,141,828 B2
(45) Date of Patent: Nov. 28, 2006

(54) FLIP-CHIP LIGHT EMITTING DIODE WITH A THERMALLY STABLE MULTIPLE LAYER REFLECTIVE P-TYPE CONTACT

(75) Inventor: Hari S. Venugopalan, Somerset, NJ (US)

(73) Assignee: GELcore, LLC, Valley View, OH (US)

( * ) Notice: Subject to any disclaimer, the term of this patent is extended or adjusted under 35 U.S.C. 154(b) by 56 days.

(21) Appl. No.: 10/249,163

(22) Filed: Mar. 19, 2003

(65) Prior Publication Data
US 2004/0182914 A1    Sep. 23, 2004

(51) Int. Cl.
*H01L 33/00*    (2006.01)
(52) U.S. Cl. .......................... 257/99; 257/79
(58) Field of Classification Search ................ 257/77, 257/91, 95, 98, 99, 103, 778, 779, 785
See application file for complete search history.

(56) References Cited

U.S. PATENT DOCUMENTS

| | | | |
|---|---|---|---|
| 4,648,095 A | 3/1987 | Iwasaki et al. | |
| 5,358,899 A | 10/1994 | Fleischman et al. | |
| 6,194,743 B1 | 2/2001 | Kondoh et al. | |
| 6,239,490 B1 | 5/2001 | Yamada et al. | |
| 6,445,011 B1 | 9/2002 | Hirano et al. | |
| 6,486,499 B1 | 11/2002 | Krames et al. | |
| 6,521,914 B1 | 2/2003 | Krames et al. | |
| 2002/0047131 A1 | 4/2002 | Shen et al. | |
| 2002/0070386 A1 | 6/2002 | Krames et al. | |
| 2002/0123164 A1* | 9/2002 | Slater et al. | 438/39 |
| 2003/0015721 A1* | 1/2003 | Slater et al. | 257/99 |
| 2003/0052328 A1* | 3/2003 | Uemura | 257/103 |

FOREIGN PATENT DOCUMENTS

| | | |
|---|---|---|
| EP | 0926744 | 6/1999 |
| EP | 1168460 | 1/2002 |
| EP | 1294028 | 3/2003 |
| WO | WO 01/47036 A1 | 6/2001 |
| WO | WO 01/47038 A1 | 6/2001 |
| WO | WO 02/067340 | 8/2002 |

OTHER PUBLICATIONS

"Reliability and Failure of Electronic Materials and Devices", Milton Ohring, Environmental Damage to Electronic Products.

(Continued)

*Primary Examiner*—Thomas L. Dickey
(74) *Attorney, Agent, or Firm*—Fay, Sharpe, Fagan, Minnich & McKee, LLP

(57) ABSTRACT

A p-type contact (30) is disclosed for flip chip bonding and electrically contacting a p-type group III-nitride layer (28) of a group III-nitride flip chip light emitting diode die (10) with a bonding pad (60). A first palladium layer (42) is disposed on the p-type group III-nitride layer (28). The first palladium layer (42) is diffused through a native oxide of the p-type group III-nitride layer (28) to make electrical contact with the p-type group III-nitride layer (28). A reflective silver layer (44) is disposed on the first palladium layer (42). A second palladium layer (46) is disposed on the silver layer (44). A bonding stack (48) including at least two layers (50, 52, 54) is disposed on the second palladium layer (46). The bonding stack (48) is adapted for flip chip bonding the p-type layer (28) to the bonding pad (60).

5 Claims, 5 Drawing Sheets

OTHER PUBLICATIONS

InxGa1-xN/AlyGa1-yN violet light emitting diodes with reflective p-contacts for high single sided light extraction, Mensz et al., Electronics Letter, Nov. 20, 1997, vol. 33, No. 24.

Written Opinion of the International Searching Authority, from International Appl. No. PCT/US2004/008514, 11 pages, (all noted references previously cited and provided), mailed Oct. 6, 2005.

* cited by examiner

FLIP-CHIP LIGHT EMITTING DIODE WITH A THERMALLY STABLE MULTIPLE LAYER REFLECTIVE P-TYPE CONTACT

BACKGROUND OF INVENTION

The present invention relates to the electronics arts. It is especially relates to flip-chip bonded group III-nitride light emitting diodes for lighting applications, and will be described with particular reference thereto. However, the invention also finds application in conjunction with other types of flip-chip bonded light emitting diodes, and in die-bonding of other optoelectronic devices such as vertical cavity surface emitting lasers (VCSELs).

In the flip-chip mounting configuration, a light emitting diode with a light-transmissive substrate and front-side electrodes is bonded "face down" to bonding bumps of a mount, that is, with the epitaxial layers proximate to the mount and the light-transmissive substrate distal from the mount. The flip-chip arrangement has a number of advantages, including improved thermal heat sinking due to the proximity of the front-side active layers to the heat sinking substrate, and elimination of electrode shadowing losses. In one such device, a group III-nitride light emitting diode that includes active group III-nitride layers on a light-transmissive sapphire or silicon carbide substrate is flip-chip bonded.

The p-type electrode of a flip-chip light emitting diode performs several tasks, including providing ohmic contacts to the active layers, efficiently reflecting light to contribute to light extraction, and providing thermal pathways for removing heat from the active layers during device operation. Moreover, the electrodes should be thermally stable at typical bonding temperatures, and should not degrade with use over time.

For group III-nitride light emitting diodes, nickel/aluminum (Ni/Al) and nickel/silver (Ni/Ag) reflecting electrodes for are known for contacting the p-type side of the diode. However, both these electrodes have problems. Ni/Al electrodes exhibit poor temperature stability, with substantial degradation of reflectivity at temperatures above 250° C. Ni/Al electrodes can show a reduction in reflectivity of about one-third, down to below 50% reflectance, after a 350° C. anneal, with corresponding decreases in light output of the light emitting diodes. Hence, Ni/Al electrodes are not thermally stable at temperatures typically used in soldering or otherwise flip-chip bonding the light emitting diode.

Ni/Ag electrodes tend to show better temperature stability. However, the silver of the Ni/Ag electrodes can migrate laterally with use over time. Migrating silver that reaches a sidewall of the device mesa produces an electrical shunting path that degrades device performance and can even produce catastrophic device shorting. Devices with Ni/Ag electrodes can exhibit catastrophic failure, and such catastrophic failure is typically experienced inside of 2000 operating hours.

SUMMARY OF INVENTION

According to one embodiment, a p-type contact is disclosed for flip chip bonding and electrically contacting a p-type group III-nitride layer of a group III-nitride flip chip light emitting diode die with a bonding pad. A first palladium layer is disposed on the p-type group III-nitride layer. The first palladium layer is diffused through a native oxide of the p-type group III-nitride layer to make electrical contact with the p-type group III-nitride layer. A reflective silver layer is disposed on the first palladium layer. A second palladium layer is disposed on the silver layer. A bonding stack including at least two layers is disposed on the second palladium layer. The bonding stack is adapted for flip chip bonding the p-type layer to the bonding pad.

According to another embodiment, a flip chip light emitting diode die is disclosed, including a light-transmissive substrate. A plurality of semiconductor layers are disposed on the light-transmissive substrate. The semiconductor layers include a p-type layer and an n-type layer. An n-electrode is formed on the n-type layer for electrically contacting a first bonding pad of an associated mount. A p-electrode is formed on the p-type layer for electrically contacting a second bonding pad of the associated mount. The p-electrode includes: an oxide diffusion layer disposed on the p-type layer that is diffused through a native oxide of the p-type layer to make electrical contact with the p-type layer; a reflective layer disposed on the oxide diffusion layer, the reflective layer being highly reflective for light generated by the semiconductor layers; and a bonding layer disposed on the reflective layer, the bonding layer being adapted for flip chip bonding the flip chip light emitting diode die to bonding pads.

According to yet another embodiment, a method is provided for flip chip bonding a group III-nitride layer of a flip chip group III-nitride light emitting diode die. A metal stack is deposited. The depositing includes depositing at least an oxide diffusion layer, a reflective layer, and a bonding layer in that order on the group III-nitride layer. The metal stack is annealed at an effective temperature for effecting improved electrical contact with the group III-nitride layer without inducing a reaction between the oxide diffusion layer and the group III-nitride layer.

Numerous advantages and benefits of the present invention will become apparent to those of ordinary skill in the art upon reading and understanding the present specification.

BRIEF DESCRIPTION OF DRAWINGS

The invention may take form in various components and arrangements of components, and in various process operations and arrangements of process operations. The drawings are only for purposes of illustrating preferred embodiments and are not to be construed as limiting the invention. In the cross-sectional views, layer thicknesses are exaggerated for visual clarity, and are therefore not drawn to scale.

DETAILED DESCRIPTION

Figure 1:
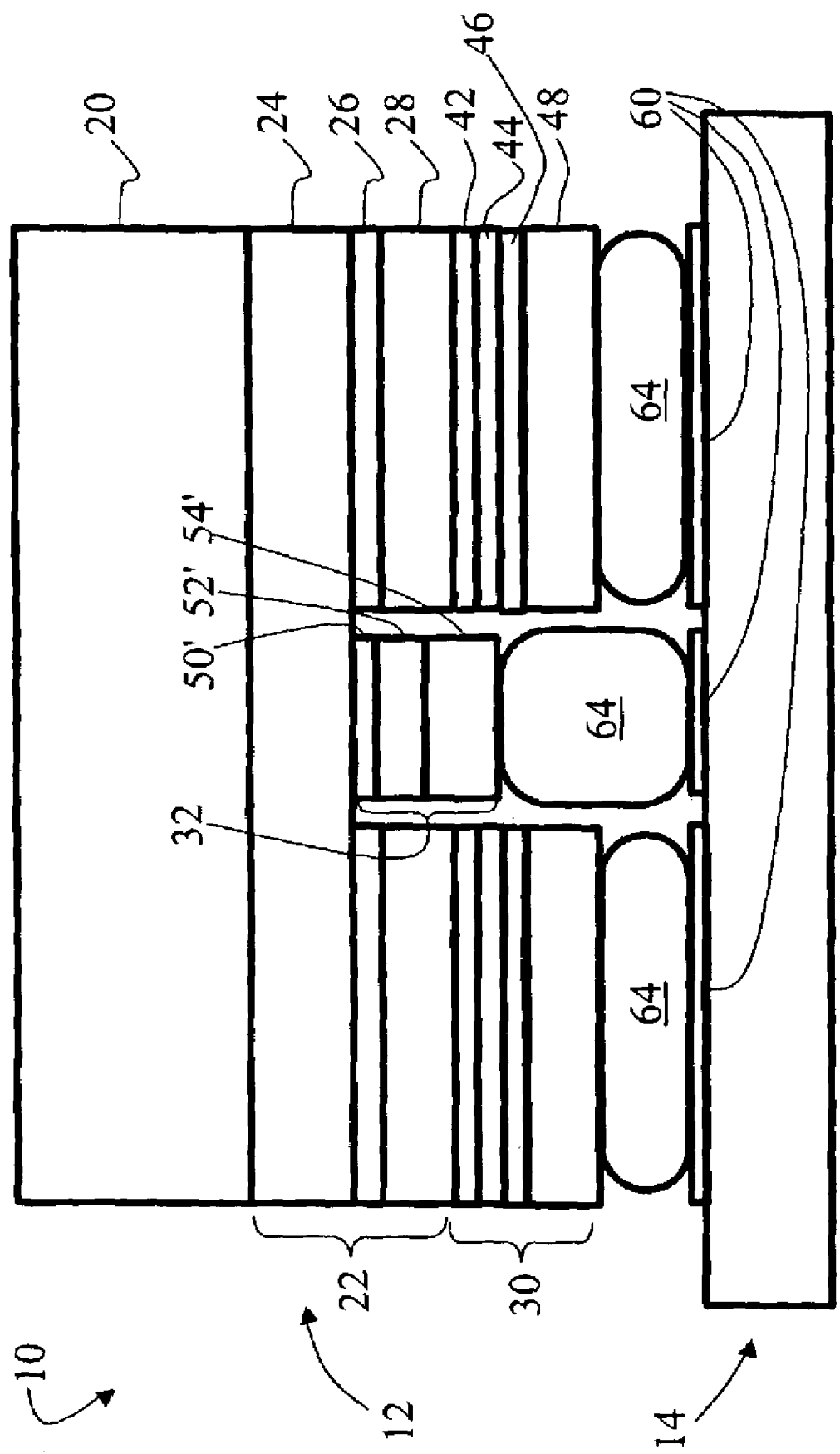
FIG. 1 shows a cross-sectional view of a flip chip group III-nitride light emitting diode.

With reference to FIG. 1, a flip-chip light emitting diode device 10 includes a light emitting diode die 12 mounted in flip chip fashion to a mount 14. The light emitting diode die 12, includes a light-transmissive substrate 20, which in a preferred embodiment is a substantially transparent sapphire or silicon carbide substrate. A plurality of semiconductor layers 22 are formed on the light-transmissive substrate 20 by metalorganic chemical vapor deposition (also referred to as organometallic vapor phase epitaxy and similar nomenclatures), molecular beam epitaxy, chemical beam epitaxy, or another epitaxial film deposition technique. In a preferred embodiment, the semiconductor layers 22 are selected group III-nitride layers such as GaN layers, AlN layers, InN layers, and ternary and quaternary alloys thereof.

The semiconductor layers 22 define a light emitting structure that emits light when suitably electrically energized. In one specific embodiment, the semiconductor layers 22 include an n-type GaN layer 24, an active region 26, and a p-type GaN layer 28. The active region 26 can include a single layer of InN, GaN, $In_xGa_{1-x}N$ (0<x<1) or the like, or the active region 26 can include a plurality of layers defining, for example, a single- or multiple-quantum well or superlattice active region. A group III-nitride-based structure typically emits light in the blue to ultraviolet spectral range, with the specific emission spectrum dependent upon the layer compositions, thicknesses, presence of certain impurities, and other features. Optionally, the semiconductor layers 22 include additional layers, such as $Al_xGa_{1-x}N$ cladding layers, a current-spreading layer, a buffer layer for promoting epitaxial growth, or the like. Those skilled in the art can readily select semiconductor layer thicknesses, materials, layer sequences, dopants and doping levels, and the like that are adapted for specific light emission applications. For example, group III-phosphide materials and group III-arsenide materials emit light in the visible to near infrared spectrum. Moreover, the device die can be another type of optoelectronic device, such as a vertical cavity surface emitting laser (VCSEL).

The semiconductor layers 22 are lithographically processed to remove portions of the active region 26 and the p-type GaN 28 to define device mesas. At least one electrode 30 is formed on the p-type GaN layer 28 atop the mesa, and at least one electrode 32 is formed on the n-GaN layer 24 where it is exposed by the lithographic processing. The p-type electrode or p-electrode 30 is preferably a multiple layer stack, including an oxide diffusion layer 42, a reflective layer 44, a migration suppressing layer 46, and a bonding stack 48.

The oxide diffusion layer 42 is preferably a palladium layer having a thickness between about five nanometers and about twenty nanometers. Palladium penetrates an oxide of the p-type group III-nitride layer, but advantageously does not react substantially with p-type group III-nitride material. Thus, palladium produces an interface that remains thermally stable at temperatures of as high as 300° C. or higher. Palladium is effective at penetrating the oxide layer of the group III-nitride material even in the as-deposited condition. However, annealing at about 250° C. improves the electrical contact. Although palladium is preferred, other metals that penetrate the oxide and provide a thermally stable interface with the group III-nitride material at elevated temperatures can also be used for the oxide diffusion layer.

The reflective layer 44 is preferably a silver layer. The silver layer 44 should be thick enough to be substantially optically opaque for light generated by the light emitting diode die 12, and to exhibit reflectivity properties substantially similar to those of bulk silver. Although silver is preferred, other reflective metals such as aluminum or rhodium can be used. However, rhodium is generally more expensive than silver, while aluminum tends to mix with the palladium at elevated temperatures.

A disadvantage of silver is that it has a tendency toward electrolytic migration. The migration suppression layer 46 is preferably disposed over the silver reflective layer 44 to reduce silver migration. Because silver-palladium combinations have greater resistance to migration than silver, the migration suppression layer 46 is preferably a palladium layer.

Figure 2:
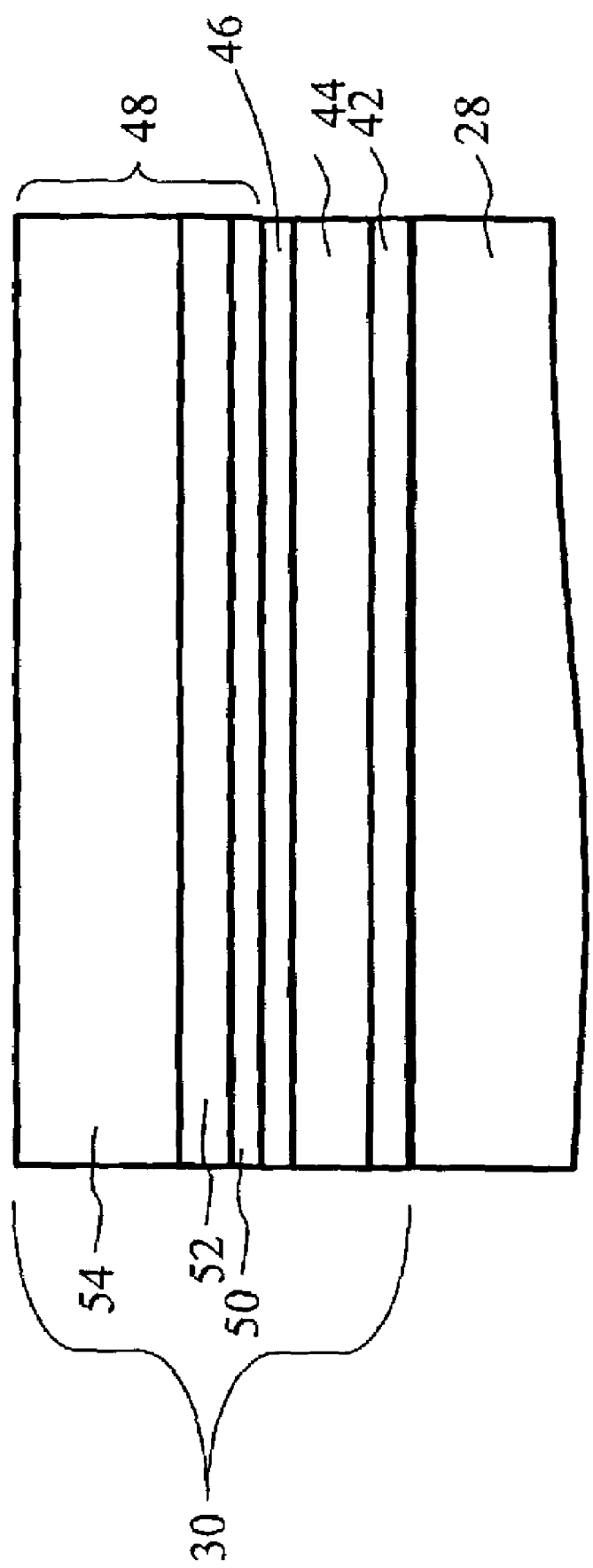
FIG. 2 shows a cross-sectional view of the p-type contact of the light emitting diode of FIG. 1.

With continuing reference to FIG. 1 and with further reference to FIG. 2, the bonding stack 48 is preferably a multiple layer metal stack, including an adhesion layer 50, a diffusion-blocking layer 52, and a bonding layer 54. The adhesion layer 50 is suitably titanium, while the bonding layer 54 is preferably gold, which provides a good bonding surface for a variety of bonding methods. For thermosonic bonding, thermocompression bonding, or the like, the diffusion-blocking layer 52 is preferably a platinum layer. For solder bonding, the diffusion-blocking layer 52 is preferably nickel. Although a three layer bonding stack 48 is preferred, the bonding stack 48 can instead consist of a single layer, two layers, or more than three layers.

In one suitable embodiment, the n-type contact 32 includes an adhesion layer 50', a diffusion-blocking layer 52', and a bonding layer 54', which are optionally deposited at the same time as the corresponding adhesion layer 50, diffusion-blocking layer 52, and bonding layer 54 of the p-type contact 30. The flip-chip light emitting diode die 12 is bonded to bonding pads 60 that laterally align with the contacts 30, 32. The bonding can be by solder bumps 64, by thermosonic bonding to gold-coated copper bumps, or the like. Optionally, the bonding bump that secures the p-type electrode 30 can be an array of bonding bumps laterally distributed to conform with the area of the p-type contact 30.

In a preferred fabrication process, the p-type group III-nitride layer 48 is cleaned with hydrochloric acid followed by a piranha etch. Although the cleaning or etching may substantially remove oxides from the p-type group III-nitride layer 28, it will be appreciated that exposure to air during subsequent processing will typically result in at least some oxide forming on the p-type group III-nitride layer 28 prior to metal deposition. Thus, wafer cleaning and etching generally does not obviate the usefulness of the oxide diffusion layer 42.

The p-type group III-nitride layer 28 is then lithographically patterned, followed by deposition of the metal layers 42, 44, 46, 48, which can be deposited in a single deposition process or in multiple deposition processes. Substantially any suitable thin film deposition technique or combination of techniques, such as thermal evaporation, electron beam evaporation, sputtering, electroplating, or the like can be employed. Subsequently, the n-type contact 32 is defined and the device is optionally protected with a dielectric layer (not shown) having windows through which the electrodes 30, 32 are exposed.

The semiconductor device including the p-type electrode 30 is annealed at 250° C. At this temperature, the palladium layers 42, 46 and silver layer 44 do not intermix, the palladium layer 42 remains substantially unreacted with the p-type group III-nitride layer 28, and the silver does not diffuse to the p-type group III-nitride layer 28. The palladium/group III-nitride interface and the palladium/silver interfaces remain substantially chemically abrupt during the 250° C. anneal.

For manufacturability, the above fabrication processes are preferably performed as wafer-level processes. After the 250° C. anneal, the wafer is diced to separate individual dice 12, which are flip-chip bonded to the submount or other support 14. In the case where the reflective layer 44 is aluminum, subsequent processing should be limited to temperatures at or below about 250° C. to avoid thermal degradation of the contact. For the preferred embodiment in which the reflective layer 44 is silver, the superior thermal stability of the silver/palladium interfaces enables subsequent processing at temperatures of 300° C. or higher.

Palladium/silver based electrodes have been experimentally compared with nickel/aluminum based electrodes. The palladium/silver based electrodes exhibited superior thermal stability, as seen with reference to FIGS. 3–5.

Figure 3:
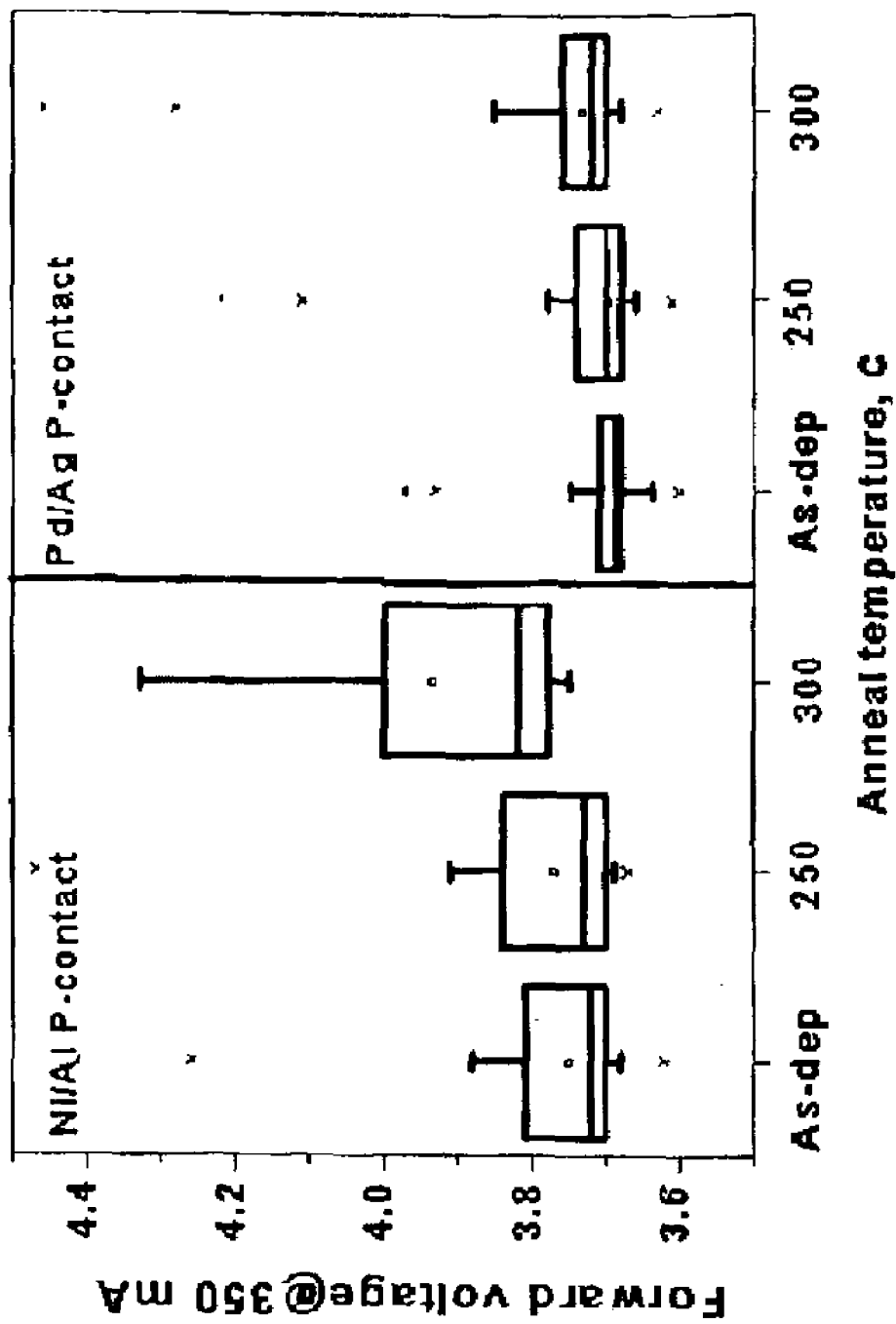
FIG. 3 shows on-wafer measurements of forward voltage ($V_f$) for light emitting diodes with nickel/aluminum based contacts (left hand side) and for light emitting diodes with palladium/silver based contacts (right hand side) as-deposited, after a 250° C. anneal, and after a 300° C. anneal.

With reference to FIG. 3, the superior thermal stability of the forward voltage of a light emitting diode employing palladium/silver based contacts is illustrated. The left-hand side of FIG. 3 shows that the nickel/aluminum based contact had a substantial increase in forward voltage after annealing at 300° C., compared with the palladium/silver based contact shown on the right-hand side of FIG. 3. The forward voltages were measured using on-wafer probing.

Figure 4:
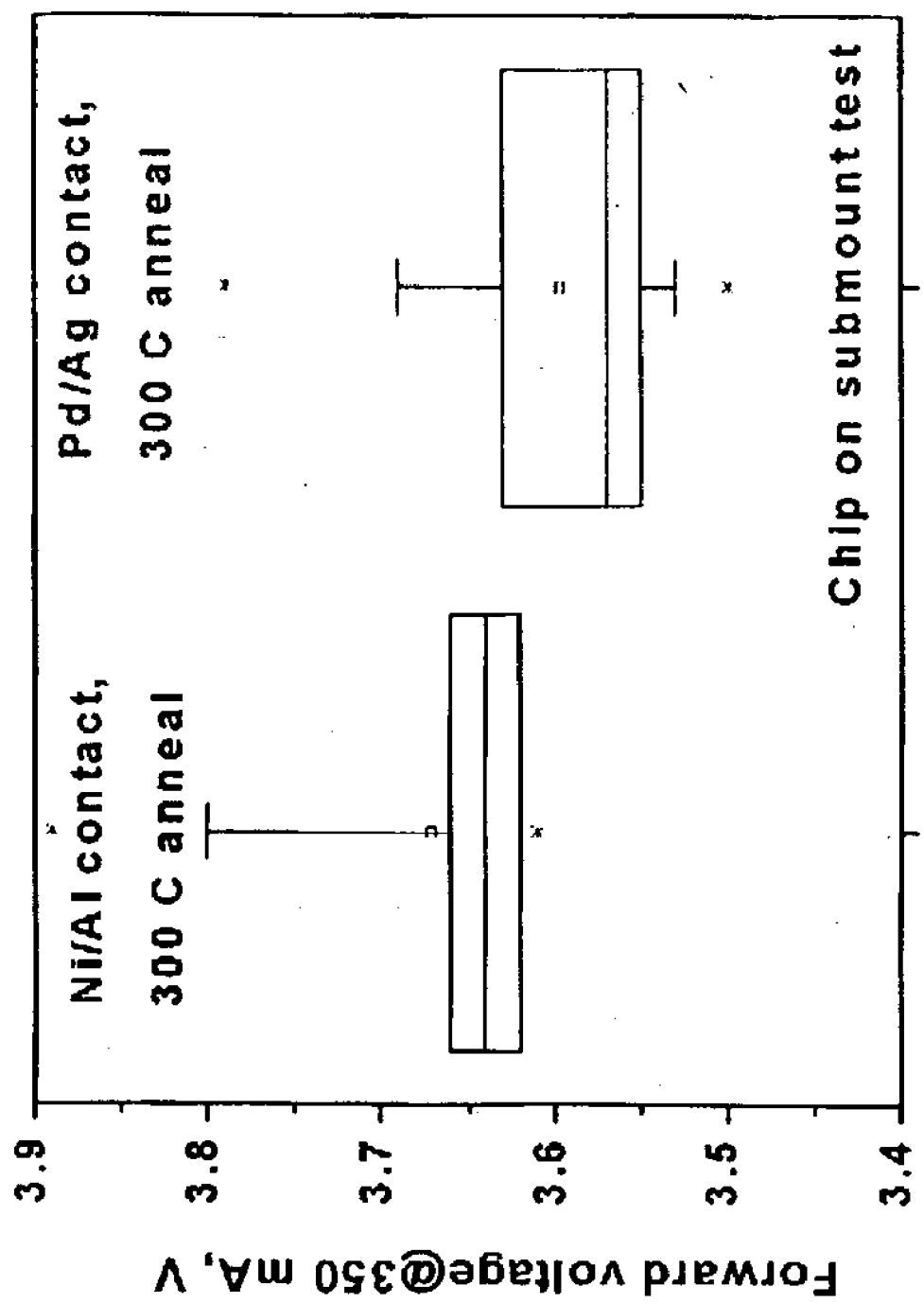
FIG. 4 shows measurements of forward voltage ($V_f$) for light emitting diodes on a submount with nickel/aluminum based contacts (left hand side) and for light emitting diodes with palladium/silver based contacts (right hand side), both after 300° C. annealing.

With reference to FIG. 4, forward voltage data measured on light emitting diode dice annealed at 300° C. and flip-chip bonded to a sub-mount are shown. The devices with nickel/aluminum based contacts and with palladium/silver based contacts were fabricated from the same wafer. The devices with palladium/silver based p-type contacts exhibited reduced forward voltages compared with devices with nickel/aluminum contacts.

Figure 5:
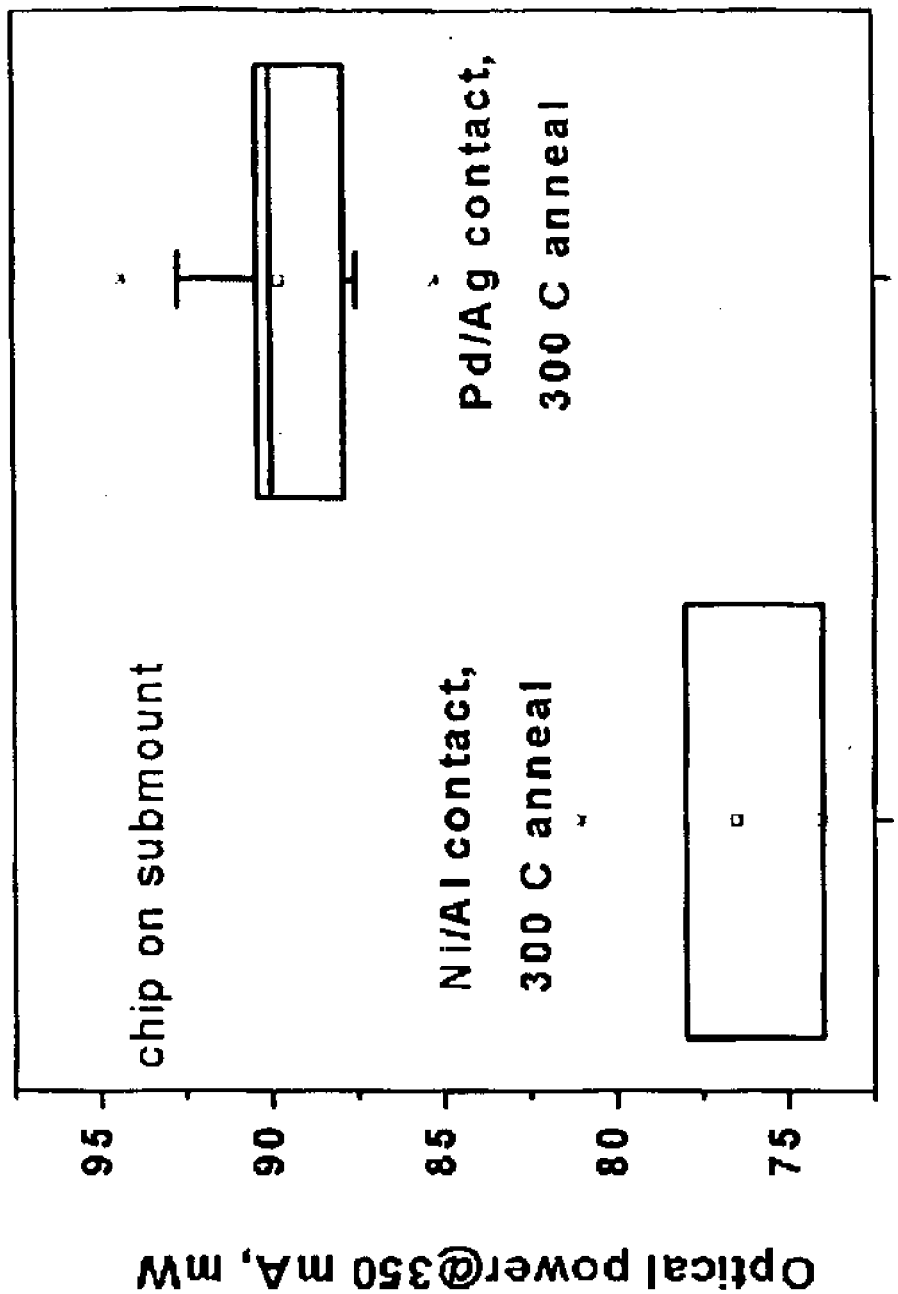
FIG. 5 shows optical power measurements for light emitting diodes on a submount with nickel/aluminum based contacts (left hand side) and for light emitting diodes with palladium/silver based contacts (right hand side), both after 300° C. annealing.

With reference to FIG. 5, an optical power measurement comparison is shown. The data of FIGS. 4 and 5 were collected from the same devices. The devices with palladium/silver based p-type contacts exhibited higher optical power outputs compared with devices with nickel/aluminum contacts. The combination of reduced forward voltage and increased optical power output provide an increase in wall plug efficiency of around 19% for the devices employing palladium/silver based contacts compared with the devices employing nickel/aluminum based contacts.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A p-type contact for flip chip bonding and electrically contacting a p-type group III-nitride layer of a group III-nitride flip chip light emitting diode die with a bonding pad, the p-type contact including:

a first palladium layer disposed on the p-type group III-nitride layer, the first palladium layer being diffused through a native oxide of the p-type group III-nitride layer to make electrical contact with the p-type group III-nitride layer;

a reflective silver layer disposed on the first palladium layer;

a second palladium layer disposed on the silver layer; and a bonding stack including at least three layers disposed on the second palladium layer, the bonding stack being adapted for flip chip bonding the p-type layer to the bonding pad, the bonding stack including a titanium adhesion layer, a gold bonding layer, and a diffusion barrier layer disposed between the adhesion layer and the bonding layer;

wherein the p-type contact does not include a dielectric layer disposed between the reflective silver layer and the bonding stack.

2. The flip chip light emitting diode as set forth in claim 1, wherein the diffusion barrier layer is selected from a group consisting of a nickel layer, a platinum layer, and a stack including a nickel layer and a platinum layer.

3. A flip chip light emitting diode die including:

a light-transmissive substrate;

a plurality of semiconductor layers disposed on the light-transmissive substrate, the semiconductor layers including a p-type layer and an n-type layer;

an n-electrode formed on the n-type layer for electrically contacting a first bonding pad of an associated mount; and a p-electrode formed on the p-type layer for electrically contacting a second bonding pad of the associated mount, the p-electrode including:

a palladium layer disposed on the p-type layer that is diffused through a native oxide of the p-type layer to make electrical contact with the p-type layer, a reflective silver layer disposed on the palladium layer, the reflective silver layer being highly reflective for light generated by the semiconductor layers, a migration suppressing palladium layer disposed on the reflective silver layer, an adhesion layer disposed on the migration suppressing palladium layer, a diffusion barrier layer disposed on the adhesion layer, and a bonding layer disposed on the adhesion layer.

4. The flip chip light emitting diode as set forth in claim 3, wherein the adhesion layer includes a titanium layer and the bonding layer includes a gold layer.

5. The flip chip light emitting diode as set forth in claim 4, wherein the diffusion barrier layer is selected from a group consisting of a platinum layer and a nickel layer.

* * * * *